(12) United States Patent
Katsuki et al.

(10) Patent No.: US 9,034,709 B2
(45) Date of Patent: May 19, 2015

(54) METHOD FOR MANUFACTURING SEMICONDUCTOR DEVICE

(71) Applicant: Asahi Kasei Microdevices Corporation, Tokyo (JP)

(72) Inventors: Shogo Katsuki, Tokyo (JP); Toshiro Sakamoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/380,967

(22) PCT Filed: Feb. 20, 2013

(86) PCT No.: PCT/JP2013/000954
§ 371 (c)(1),
(2) Date: Aug. 26, 2014

(87) PCT Pub. No.: WO2013/132766
PCT Pub. Date: Sep. 12, 2013

(65) Prior Publication Data
US 2015/0024564 A1    Jan. 22, 2015

(30) Foreign Application Priority Data
Mar. 8, 2012    (JP) .................................. 2012-052123

(51) Int. Cl.
*H01L 27/112*    (2006.01)
*H01L 21/8234*    (2006.01)
(Continued)

(52) U.S. Cl.
CPC ......... *H01L 21/823462* (2013.01); *H01L 29/78* (2013.01); *H01L 21/2822* (2013.01); *H01L 21/02164* (2013.01); *H01L 21/02271* (2013.01); *H01L 21/28167* (2013.01); *H01L 21/324* (2013.01); *Y10S 438/981* (2013.01)

(58) Field of Classification Search
None
See application file for complete search history.

(56) References Cited

U.S. PATENT DOCUMENTS

2001/0018245 A1    8/2001    Kimizuka
2001/0018274 A1    8/2001    Sugizaki et al.
(Continued)

FOREIGN PATENT DOCUMENTS

JP    61-164266 A    7/1986
JP    H08-316465 A    11/1996
(Continued)

OTHER PUBLICATIONS

International Search Report dated Mar. 19, 2013 for International application No. PCT/JP2013/000954.
(Continued)

*Primary Examiner* — Mark A Laurenzi
*Assistant Examiner* — Bo Bin Jang
(74) *Attorney, Agent, or Firm* — Morgan, Lewis & Bockius LLP

(57) ABSTRACT

A method for manufacturing a semiconductor device, includes forming a first gate oxide film in each of a first region and a second region by thermally oxidizing a silicon substrate, forming a CVD oxide film on the first gate oxide film, implanting fluorine into each of the first region and the second region through the CVD oxide film and the first gate oxide film, removing the CVD oxide film from the first gate oxide film in the second region, removing the first gate oxide film from the second region, and forming a second gate oxide film in the second region by thermally oxidizing the silicon substrate.

4 Claims, 12 Drawing Sheets

(51) Int. Cl.
*H01L 21/28* (2006.01)
*H01L 21/02* (2006.01)
*H01L 21/324* (2006.01)
*H01L 29/78* (2006.01)

(56) References Cited

U.S. PATENT DOCUMENTS

2006/0121740 A1* 6/2006 Sakai et al. ............... 438/758
2007/0173023 A1   7/2007 Okazaki et al.
2010/0013017 A1   1/2010 Tsutsui

FOREIGN PATENT DOCUMENTS

| | | |
|---|---|---|
| JP | 2001-237325 A | 8/2001 |
| JP | 2001-244345 A | 9/2001 |
| JP | 2004-281692 A | 10/2004 |
| JP | 2007-200976 A | 8/2007 |
| JP | 2010-027823 A | 2/2010 |

OTHER PUBLICATIONS

International Preliminary Report on Patentability dated Sep. 18, 2014 for the corresponding International Application No. PCT/JP2013/000954.

* cited by examiner

FIRST REGION | SECOND REGION

FIRST REGION | SECOND REGION

FIRST REGION | SECOND REGION

FIRST REGION | SECOND REGION

FIRST REGION | SECOND REGION

FIRST REGION | SECOND REGION

FIRST REGION SECOND REGION

FIRST REGION SECOND REGION

FIRST REGION | SECOND REGION

FIRST REGION | SECOND REGION

FIRST REGION | SECOND REGION

FIRST REGION | SECOND REGION

METHOD FOR MANUFACTURING SEMICONDUCTOR DEVICE

This application is a national stage application based on and claiming the benefit of priority from PCT/JP2013/000954, filed on Feb. 20, 2013, which is based on and claims the benefit of priority from Japanese application No. 2012-052123, filed on Mar. 8, 2012, the contents of both are hereby incorporated by reference.

TECHNICAL FIELD

The present invention relates to a method for manufacturing a semiconductor device.

BACKGROUND ART

The conditions of a gate oxide film/silicon substrate interface of a MOSFET (Metal-Oxide-Semiconductor Field-Effect Transistor; hereinafter referred to as a MOS transistor) formed on a silicon substrate are important, because the conditions influence the properties of the MOS transistor. The presence of carrier traps at a gate oxide film/silicon substrate interface causes problems such as mobility reduction and increase of 1/f noise. Therefore, formation of a gate oxide film/silicon substrate interface that has as few carrier traps as possible is desirable.

Typical carrier traps are interface states. Interface states are states that occur in a forbidden band at a surface of a semiconductor due to uncoupled bonds (i.e. dangling bonds) of crystal atoms. In order to reduce interface states, therefore, dangling bonds need to be terminated.

A typical way to terminate dangling bonds is to combine hydrogen, fluorine atoms, or the like each having only one bond, with dangling bonds. PTL 1 describes a method in which fluorine ions are implanted in a polysilicon film that will serve as a gate electrode and fluorine is introduced into a gate oxide film and a gate oxide film/silicon substrate interface by a subsequent thermal treatment. PTL 2 describes another method in which fluorine ions are implanted into a silicon substrate prior to formation of a gate oxide film and fluorine is introduced in a gate oxide film/silicon substrate interface and in the gate oxide film by thermal treatment during formation of the gate oxide film.

CITATION LIST

Patent Literature

PTL 1: JP 2004-281692 A
PTL 2: JP 2010-27823 A

SUMMARY OF INVENTION

According to one aspect of the present invention, there is provided a method for manufacturing a semiconductor device, the semiconductor device including a first MOS transistor in a first region of a semiconductor substrate and a second MOS transistor in a second region of the semiconductor substrate, the method including: forming a first gate oxide film in each of the first region and the second region by thermally oxidizing the semiconductor substrate; forming a protective film on the first gate oxide film; implanting fluorine into each of the first region and the second region through the protective film and the first gate oxide film; removing, after the implantation of the fluoride, the protective film from the first gate oxide film in the second region; removing the first gate oxide film from the second region; and forming a second gate oxide film in the second region by thermally oxidizing the semiconductor substrate in a state where the first gate oxide film is left in the first region and the first gate oxide film is removed from the second region, the second gate oxide film being different in thickness or type from the first gate oxide film.

DESCRIPTION OF EMBODIMENTS

With the method in PTL 1, if the gate oxide film is as thin as approximately 5 (nm) or less, fluorine implanted into the gate electrode (a polysilicon film) diffuses together with other impurities, such as boron, already introduced in the gate electrode, into the gate oxide film and then to the gate oxide film/silicon substrate interface from the gate oxide film. As a result, elements other than fluorine that exist in the gate electrode also seep to the silicon substrate side. This can cause various problems such as fluctuations of the threshold voltage and an increase in variations in the threshold voltage of MOS transistors.

The method described in PTL 2 can prevent impurities from seeping from the gate electrode because fluorine is implanted into the silicon substrate. However, the method has a problem that, in two types of MOS transistors that have gate oxide films with different thicknesses, the amounts of fluorine introduced into the gate oxide film/silicon substrate interface are significantly different between the two MOS transistors.

The problem will be described with reference to FIGS. 8A, 8B, 9A, 9B, 10A, 10B, 11A, 11B, 12A, and 12B.

FIGS. 8A, 8B, 9A, 9B, 10A, 10B, 11A, 11B, 12A, and 12B are cross-sectional views illustrating a method for manufacturing a semiconductor device according to an example of an existing technique in process sequence and diagrams illustrating concentration profiles of fluorine in the depth direction in first and second regions in the cross-sectional views. FIGS. 8B, 9B, 10B, 11B, and 12B represent data obtained by actually conducting simulations by the present inventors, where the horizontal axis represents the depth (μm) from the surface of a silicon substrate and the vertical axis represents fluorine concentration ($cm^{-3}$).

Figure 8A:
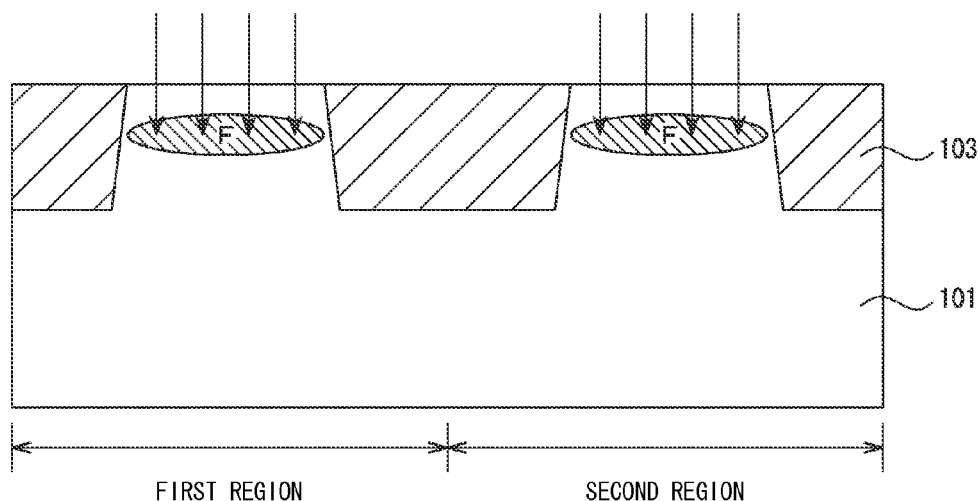
FIGS. 8A and 8B are diagrams illustrating a method for manufacturing a semiconductor device according to an example of existing technique (part 1)
Figure 8B:
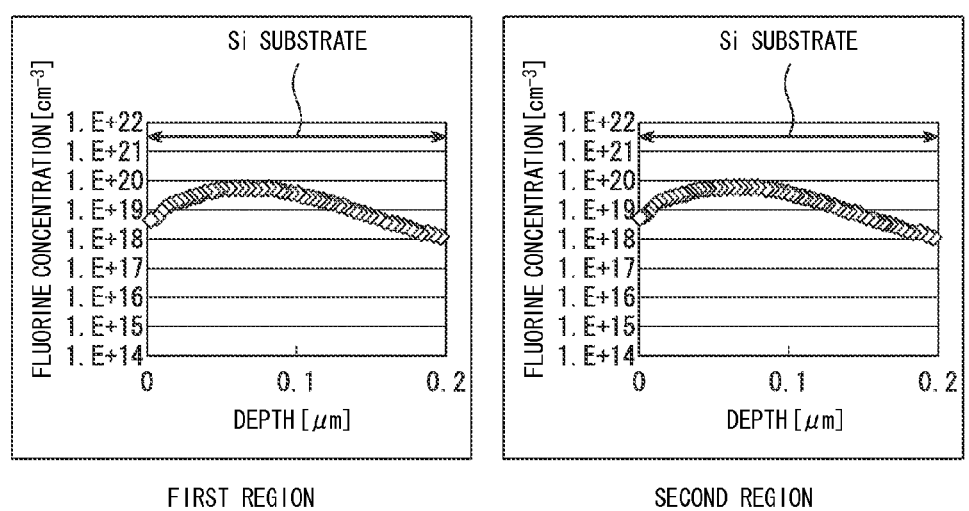

In FIG. 8A, an STI (Shallow Trench Isolation) layer 103 is formed on the silicon substrate 101 to isolate a region where a first MOS transistor is to be formed (hereinafter referred to as the first region) and a region where a second MOS transistor is to be formed (hereinafter referred to as the second region) from each other. Then, ions of fluorine (F) are implanted into the silicon substrate 101. The ion implantation is conducted under the conditions where an implantation energy of approximately 30 keV and a dose of approximately 5e14 ($cm^{-2}$), for example. Fluorine is implanted into the first and second regions at the same time under the same conditions. Accordingly, the concentration profiles of fluorine in the first and second regions are substantially identical as illustrated in FIG. 8B.

Figure 9A:
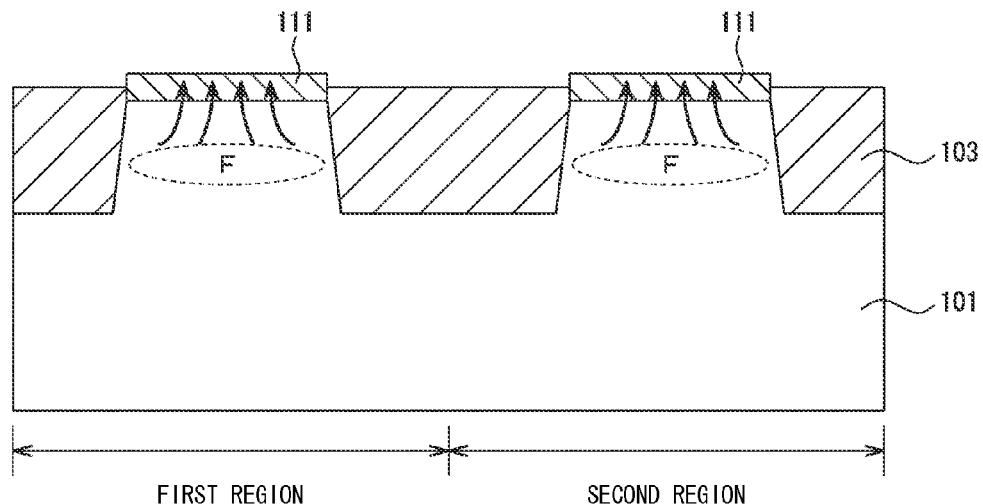
FIGS. 9A and 9B are diagrams illustrating the manufacturing a semiconductor device according to the example of existing technique (part 2)
Figure 9B:
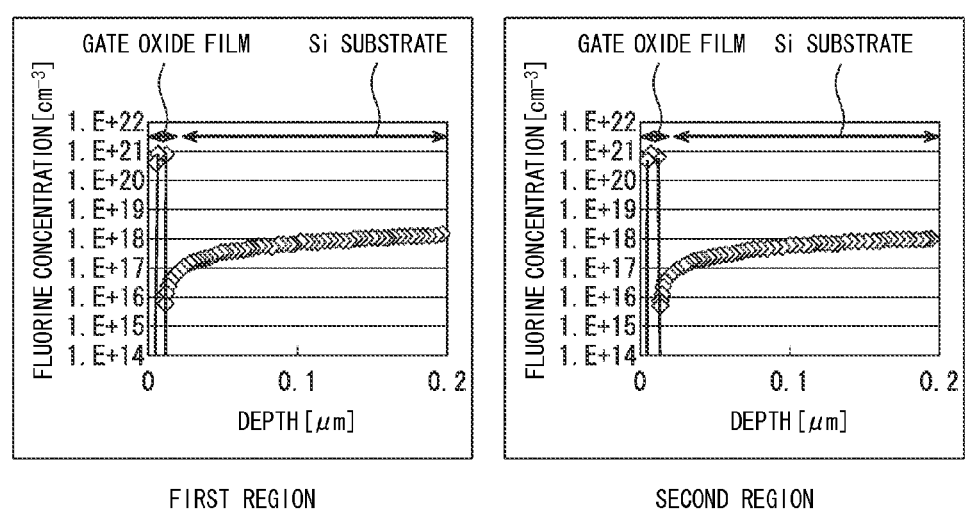

Then, as illustrated in FIG. 9A, the surface of the silicon substrate 101 is thermally oxidized to form a first gate oxide film 111 in each of the first region and the second region. During the formation, fluorine implanted in the silicon substrate 101 is taken into the first gate oxide film 111/silicon substrate 101 interface and the first gate oxide film 111. As illustrated in FIG. 9B, fluorine in the silicon substrate 101 is segregated in the first gate oxide film 111 and near the first gate oxide film 111/silicon substrate 101 interface in each of the first and second regions.

Figure 10A:
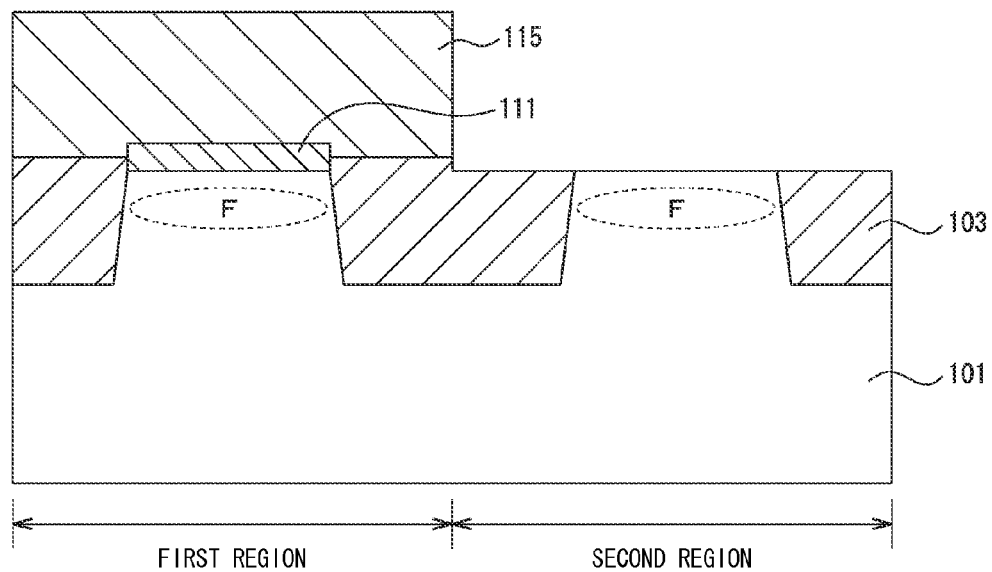
FIGS. 10A and 10B are diagrams illustrating the method for manufacturing a semiconductor device according to the example of existing technique (part 3)
Figure 10B:
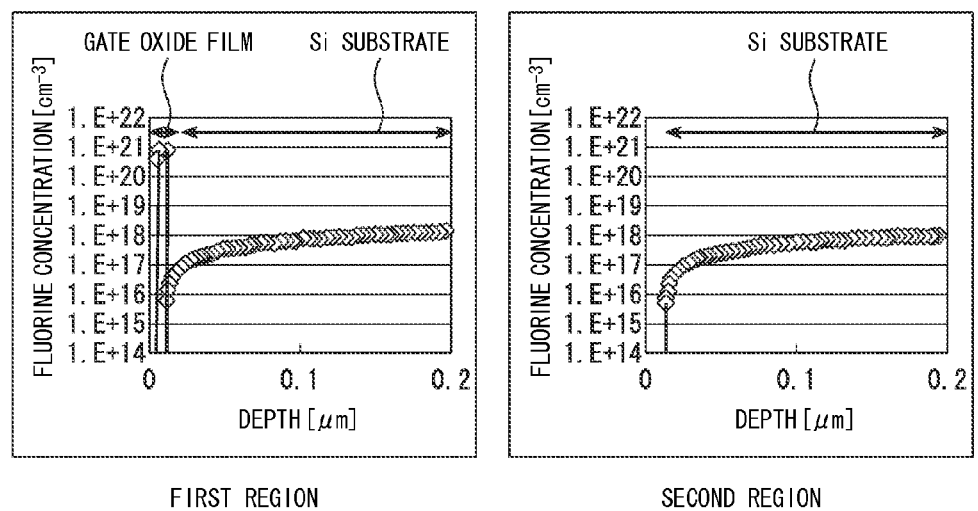

Then, as illustrated in FIG. 10A, a resist pattern 115 having a shape which covers the first region and exposes the top of the second region is formed over the silicon substrate 101. The resist pattern 115 is used as a mask to wet-etch the first gate oxide film 111. This removes the first gate oxide film 111 from the second region to expose the surface of the second region. Because of the removal of the first gate oxide film 111 into which fluorine has been taken, the fluorine concentration near the surface of the silicon substrate 101 in the second region is significantly reduced as illustrated in FIG. 10B.

Figure 11A:
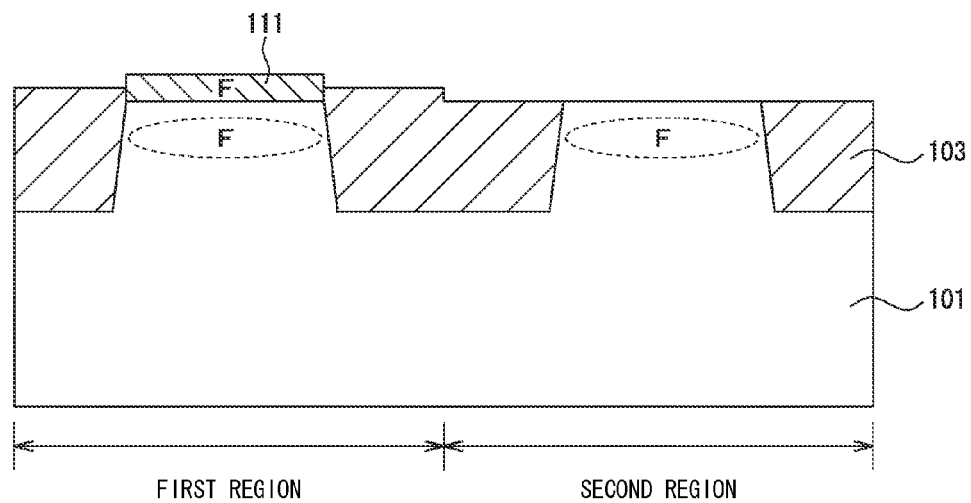
FIGS. 11A and 11B are diagrams illustrating the method for manufacturing a semiconductor device according to the example of existing technique (part 4)
Figure 11B:
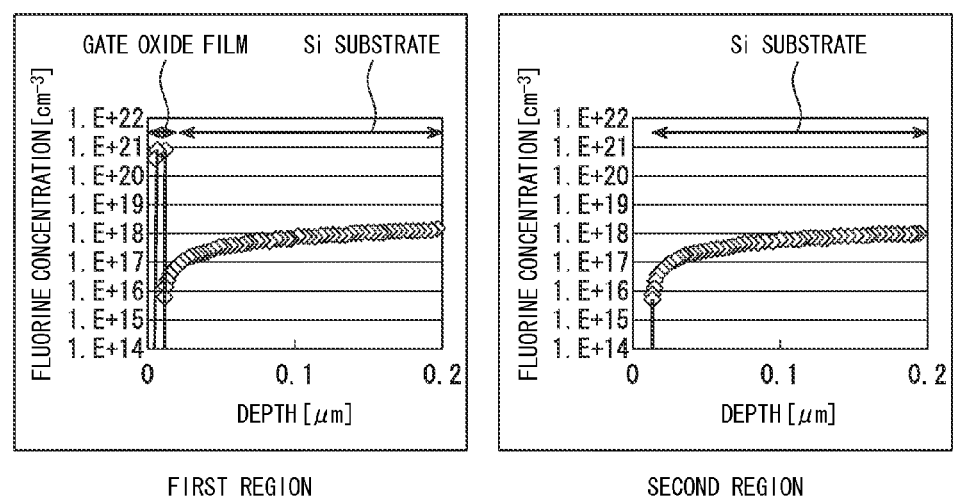
Figure 12A:
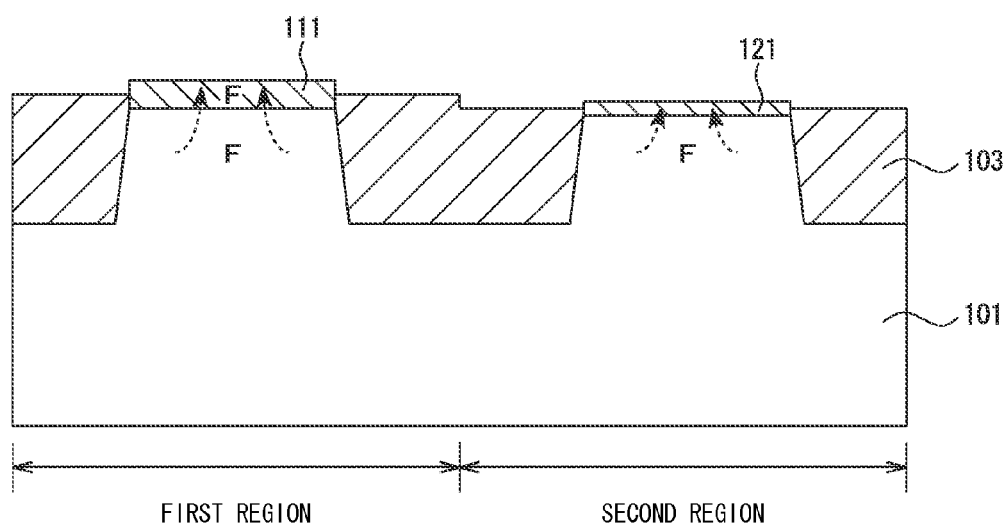
FIGS. 12A and 12B are diagrams illustrating the method for manufacturing a semiconductor device according to the example of existing technique (part 5).

Then, the resist pattern is removed as illustrated in FIG. 11A. As can be seen from comparison between FIG. 10B and FIG. 11B, the removal of the resist pattern does not change the fluorine concentration profiles. The surface of the silicon substrate 101 is then thermally oxidized again to form a second gate oxide film 121 in the second region as illustrated in FIG. 12A. During the formation, fluorine in the silicon substrate 101 is taken into the second gate oxide film 121/silicon substrate 101 interface and the second gate oxide film 121. As a result, fluorine is segregated in the second gate oxide film 121 and near the second gate oxide film 121/silicon substrate 101 interface in the second region as illustrated in FIG. 12B.

Figure 12B:
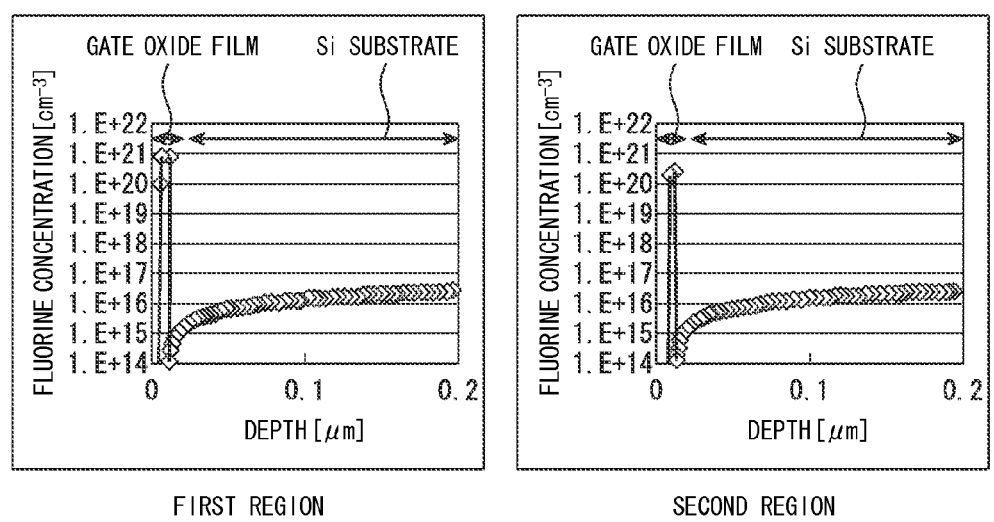

In the example of the existing technique, the fluorine concentration at the second gate oxide film 121/silicon substrate 101 interface in the second region (herein after referred to as the second interface) is lower than the fluorine concentration near the first gate oxide film 111/silicon substrate 101 interface in the first region (hereinafter referred to as the first interface) as illustrated in FIG. 12B. This is because most of the fluorine implanted into the silicon substrate 101 is introduced into the first gate oxide film 111 in the thermal oxidation step (see FIG. 9A). The first gate oxide film 111 which contains a large amount of fluorine is removed from the second region in the subsequent step (see FIG. 10A).

Consequently, only a small amount of fluorine is left in the silicon substrate 101 when the second gate oxide film 121 is formed in the second region and therefore only a small amount of fluorine diffuses from the silicon substrate 101 to the second interface. Accordingly, the fluorine concentration near the second interface is lower than the fluorine concentration near the first interface. The lower fluorine concentration at the second interface may inhibit sufficient termination of dangling bonds at the second interface.

An object of one embodiment of the present invention is to provide a method for manufacturing a semiconductor device, capable of preventing impurities from being introduced from a gate electrode to a gate oxide film/semiconductor substrate interface in each of two MOS transistors having gate oxide films that are different in thicknesses or type and keeping the concentration of fluorine at the interface high.

In a method for manufacturing a semiconductor device according to one embodiment of the present invention, fluorine is directly implanted into the semiconductor substrate without passing through a gate electrode. Accordingly, impurities (i.e. a donor element or an accepter element) contained in the gate electrode can be prevented from diffusing through the gate oxide film together with fluorine and being introduced into the gate oxide film/semiconductor substrate interface, thereby facilitating introduction of fluorine alone to the interface. Thus, fluctuations in the threshold voltages of MOS transistors and the like can be prevented.

Figure 7A:
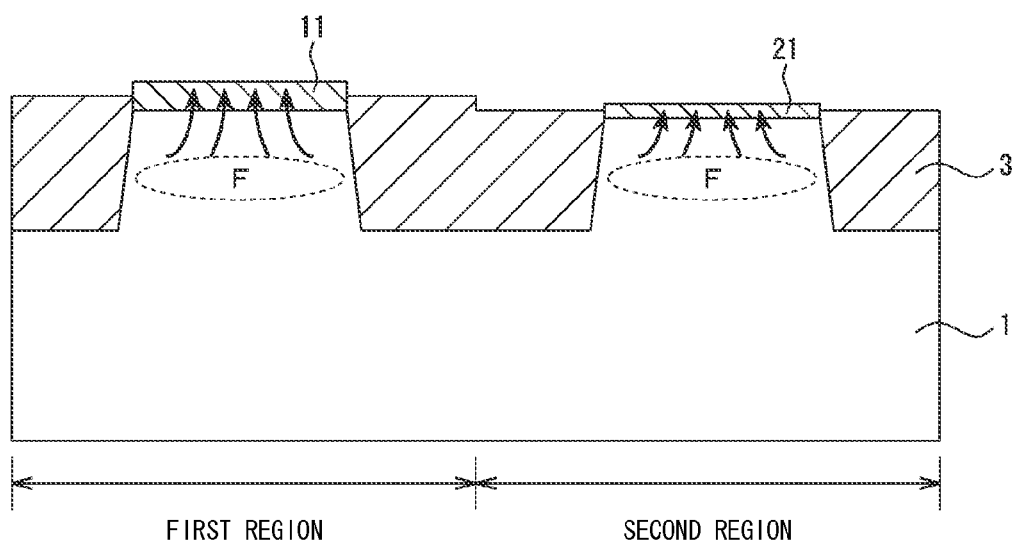
FIGS. 7A and 7B are diagrams illustrating the method for manufacturing a semiconductor device according to the embodiment (part 7)

The fluorine is implanted between the forming the first gate oxide film (see FIG. 2A) and the forming the second gate oxide film (see FIG. 7A). Accordingly, fluorine implanted into the semiconductor substrate is diffused by heat during the formation of the second gate oxide film rather than heat during the formation of the first gate oxide film. Therefore, the fluorine concentration at the first gate oxide film/semiconductor substrate interface in the first region (i.e. the first interface) can be kept high and the fluorine concentration at the second gate oxide film/semiconductor substrate interface in the second region (i.e. the second interface) can also be kept high. Consequently, dangling bonds at each of the first and second interfaces can be sufficiently terminated to reduce interface states. Note that the "semiconductor substrate" in the present invention may be a silicon substrate 1, for example, which will be described later. The "protective film" may be a CVD oxide film 13, for example, which will be described later.

The method for manufacturing semiconductor device according to the embodiment of the present invention may include forming a silicon oxide film as a protective film by a low-pressure CVD method after the formation of the first gate oxide film. This manufacturing method can prevent damage to the first gate oxide film that would otherwise occur during fluorine ion implantation.

The method for manufacturing a semiconductor device according to the embodiment of the present invention may further include removing the protective film from the first gate oxide film in the first region, between the removing the first gate oxide film from the second region and the forming the second gate oxide film in the second region. In this manufacturing method, the protective film is not present on top of the first gate oxide film when the second gate oxide film is formed.

In the method for manufacturing a semiconductor device according to the embodiment of the present invention, the semiconductor substrate may be a silicon substrate, and a silicon oxide film may be formed as the first gate oxide film in the forming the first gate oxide film, and a silicon oxide film may be formed as the protective film by a low-pressure CVD method in the forming the protective film. In this manufacturing method, the first gate oxide film is a silicon oxide film formed by thermal oxidation (i.e. a thermal oxide film), the protective film is a silicon oxide film formed by a low-pressure CVD method (i.e. a CVD oxide film). Hydrogen fluoride solution (i.e. hydrofluoric acid) etches the CVD oxide film at an etch rate well higher than the etch rate at which it etches the thermal oxide film. Accordingly, the protective film can be etched off with a high selectivity with respect to the first gate oxide film. Loss of the thickness of the first gate oxide film in the first region during the removal of the protective film can be minimized.

According to the embodiment of the present invention, impurities can be prevented from being introduced from a gate electrode to a gate oxide film/semiconductor substrate interface in each of two MOS transistors having gate oxide films that are different in thicknesses or type and the concentration of fluorine at the interface can be kept high.

Embodiments of the present invention will now be described with reference to the drawings. In the drawings which will be described later, elements having the same configurations are given like reference numerals throughout the drawings and repeated description thereof will be omitted.

(1) Manufacturing Method

FIGS. 1A, 1B, 2A, 2B, 3A, 3B, 4A, 4B, 5A, 5B, 6A, 6B, 7A, and 7B are cross-sectional views illustrating a method for manufacturing a semiconductor device according to an embodiment of the present invention in process sequence and diagrams illustrating concentration profiles of fluorine in the depth direction in first and second regions in the cross-sectional views. FIGS. 1B, 2B, 3B, 4B, 5B, 6B, AND 7B represent data obtained by actually conducting simulations by the present inventors, where the horizontal axis represents the depth (μm) from the surface of a silicon substrate 1 and the vertical axis represents fluorine concentration ($cm^{-3}$).

Figure 1A:
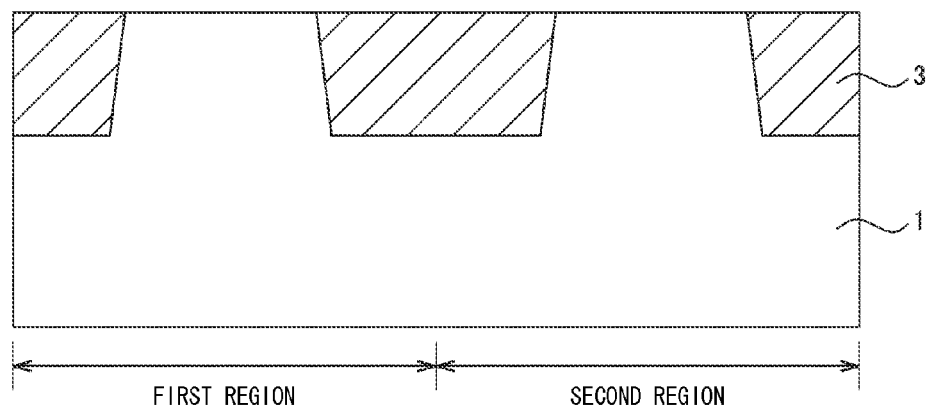
FIGS. 1A and 1B are diagrams illustrating a method for manufacturing a semiconductor device according to an embodiment (part 1)

In FIG. 1A, first a silicon substrate 1 is provided. The silicon substrate 1 may be a bare wafer, for example. Then, a field oxide film 3 is formed on the silicon substrate 1 to isolate a region where a first MOS transistor is to be formed (hereinafter referred to as the first region) and a region where a second MOS transistor is to be formed (hereinafter referred to as the second region) from each other. In this embodiment, an STI (Shallow Trench Isolation) layer, for example, is formed as the field oxide film 3. Alternatively, a LOCOS (Local Oxidation of Silicon) layer, not depicted, may be formed as the field oxide film 3. A LOCOS layer is a silicon oxide film formed by a LOCOS process. In this embodiment, the field oxide film 3 may be of any type that functions as an element isolation layer.

Although not depicted, impurity ions are then implanted into the silicon substrate 1 once or more times in order to form a well diffusion layer or to adjust the threshold voltage of the MOS transistors. Depending on the purpose, donor or accepter element ions are implanted into the silicon substrate 1.

Figure 2A:
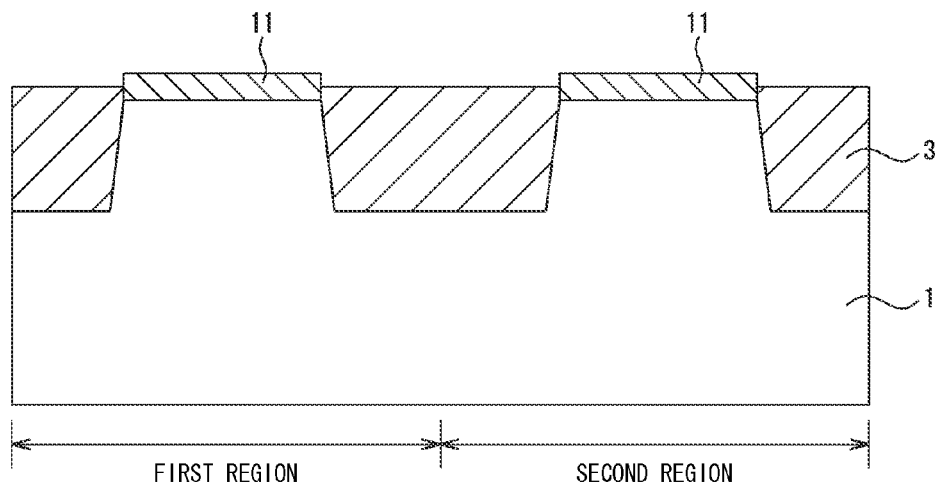
FIGS. 2A and 2B are diagrams illustrating the method for manufacturing a semiconductor device according to the embodiment (part 2)

Then, the surface of the silicon substrate 1 is thermally oxidized to form a first gate oxide film 11 in each of the first and second regions as illustrated in FIG. 2A. The first gate oxide film 11 may be a silicon oxide film, for example, with a thickness of approximately 7 (nm), for example.

Figure 1B:
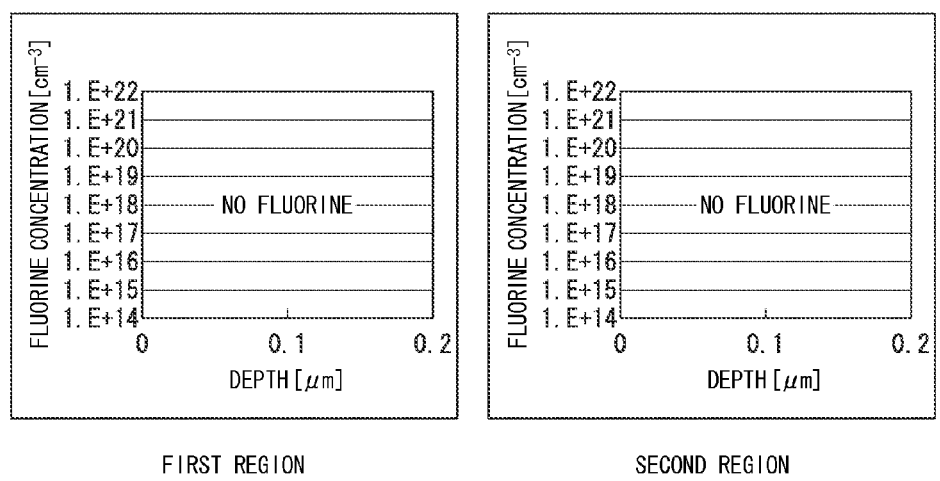
Figure 2B:
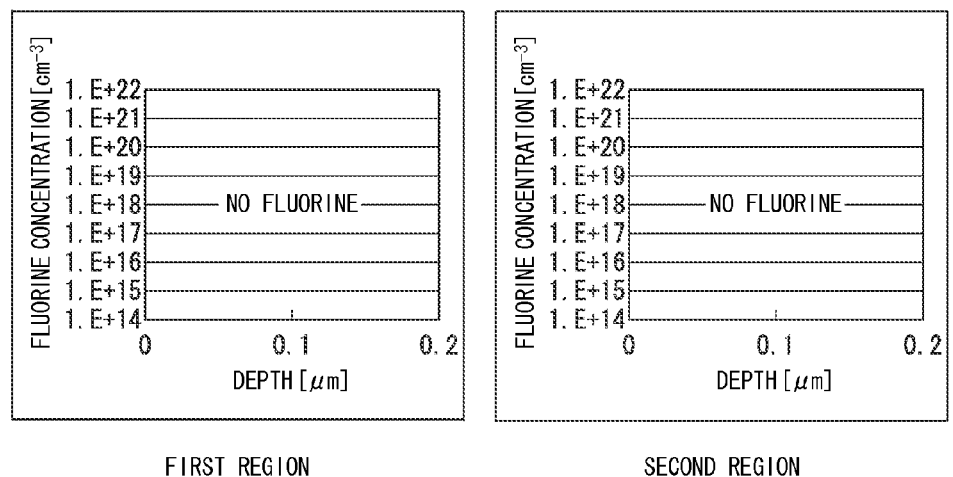
Figure 3A:
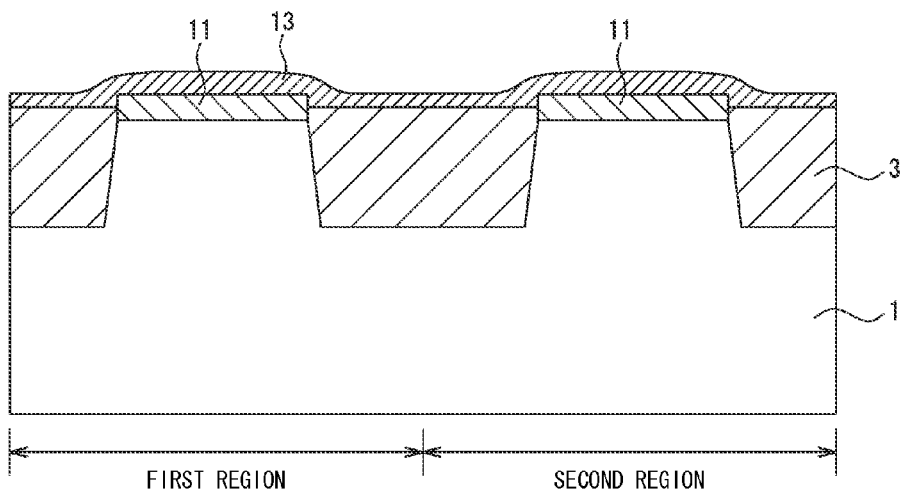
FIGS. 3A and 3B are diagrams illustrating the method for manufacturing a semiconductor device according to the embodiment (part 3)
Figure 3B:
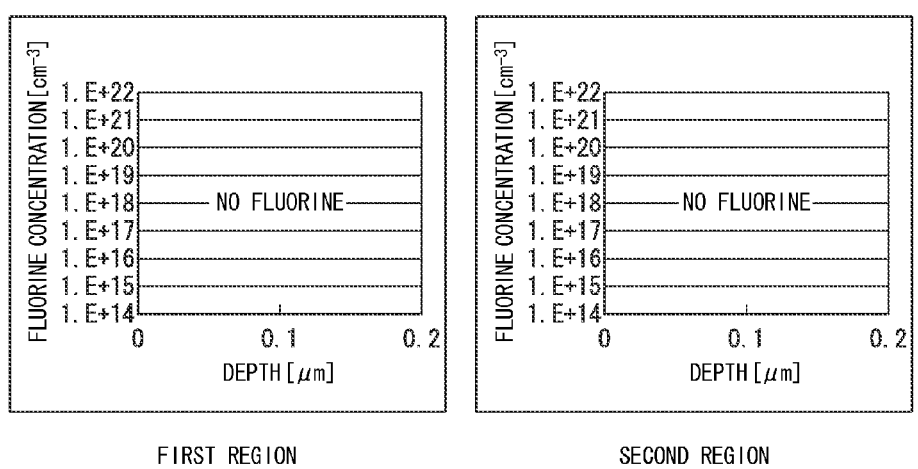

Then, as illustrated in FIG. 3A, a silicon oxide film is deposited on the silicon substrate 1 by a low-pressure CVD (Chemical Vapor Deposition) method. The term "low-pressure" in the low-pressure CVD method means that the pressure in the reaction chamber where film deposition is performed is low. The low pressure range is between 10 and 100 (Pa), for example. The silicon oxide film 13 deposited by the low-pressure CVD method (hereinafter referred to as the CVD oxide film) covers each of the first gate oxide film 11 in the first region and the first gate oxide film 11 in the second region. The CVD oxide film 13 is approximately 5 to 15 (nm) thick, for example. Note that, as illustrated in FIGS. 1B, 2B and 3B, fluorine has not been implanted into the silicon substrate 1 in the process from the provision of the silicon substrate 1 to the formation of the CVD oxide film 13 in this embodiment.

Figure 4A:
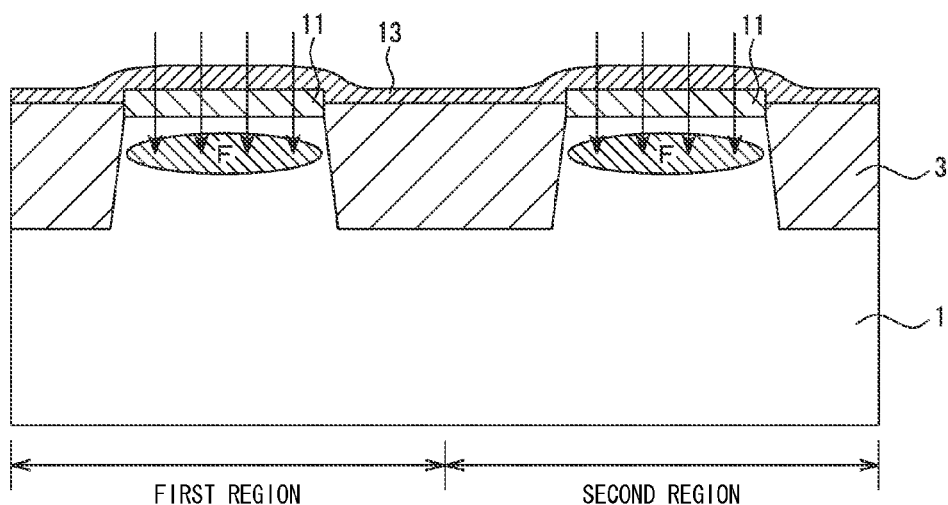
FIGS. 4A and 4B are diagrams illustrating the method for manufacturing a semiconductor device according to the embodiment (part 4)
Figure 4B:
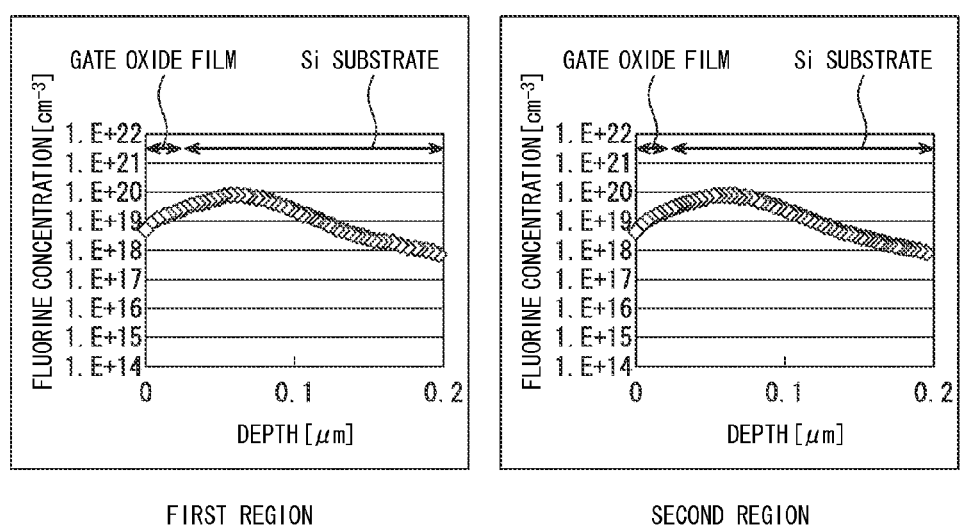

Then, as illustrated in FIG. 4A, fluorine (F) ions are implanted into the silicon substrate 1 through the CVD oxide film 13 and the first gate oxide film 11. The ion implantation is conducted under the conditions where an implantation energy of approximately 30 keV and a dose of approximately 5e14 ($cm^{-2}$), for example. As a result, concentration profiles of fluorine as illustrated in FIG. 4B are formed in each of the first and second regions. Note that fluorine is implanted into the first and second regions at the same time under the same conditions in this embodiment. Accordingly, the concentration profiles of fluorine in the first and second regions are substantially identical.

Figure 5A:
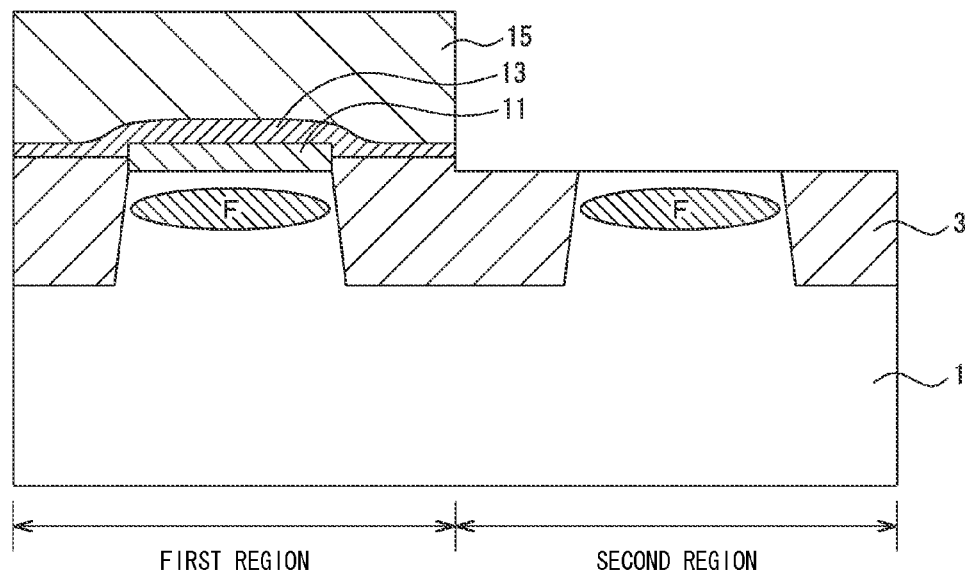
FIGS. 5A and 5B are diagrams illustrating the method for manufacturing a semiconductor device according to the embodiment (part 5)
Figure 5B:
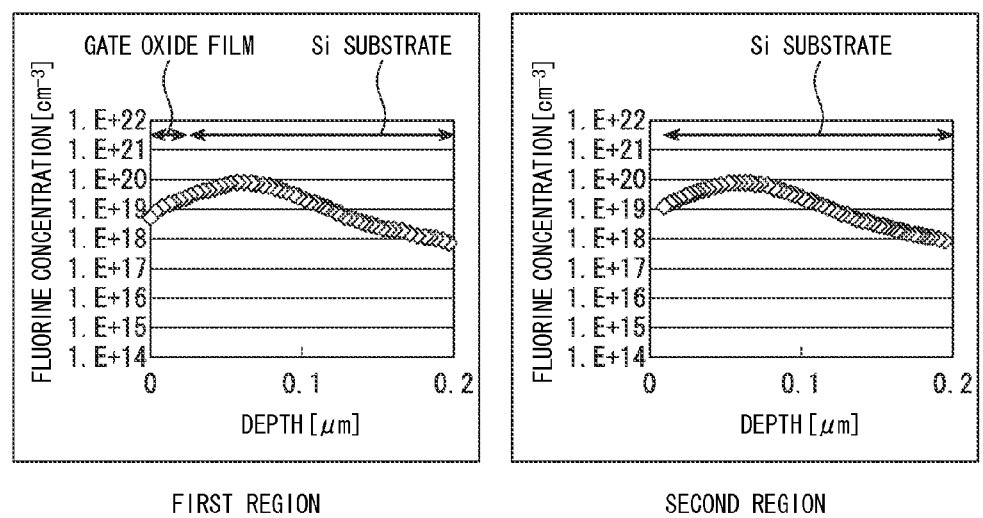

Then, as illustrated in FIG. 5A, a resist pattern 15 having a shape which covers the first region and exposes the top of the second region is formed on the CVD oxide film 13. The resist pattern 15 is used as a mask to wet-etch off the CVD oxide film 13 and the first gate oxide film 11. The wet etching may be performed using hydrofluoric acid and the like, for example. As a result, the first gate oxide film 11 and the CVD oxide film 13 are left in the first region whereas the CVD oxide film 13 and the first gate oxide film 11 are removed from the second region to expose the surface of the second region.

Note that the CVD oxide film 13 lies between the first gate oxide film 11 and the resist pattern 15 in the step illustrated in FIG. 5A. This can prevent the first gate oxide film 11 from being contaminated with organic substances contained in the resist pattern 15. Furthermore, since fluorine is implanted in the silicon substrate 1, the removal of the first gate oxide film 11 from the second region does not change the concentration profile of fluorine as can be seen by comparison between FIGS. 4B and 5B.

Figure 6A:
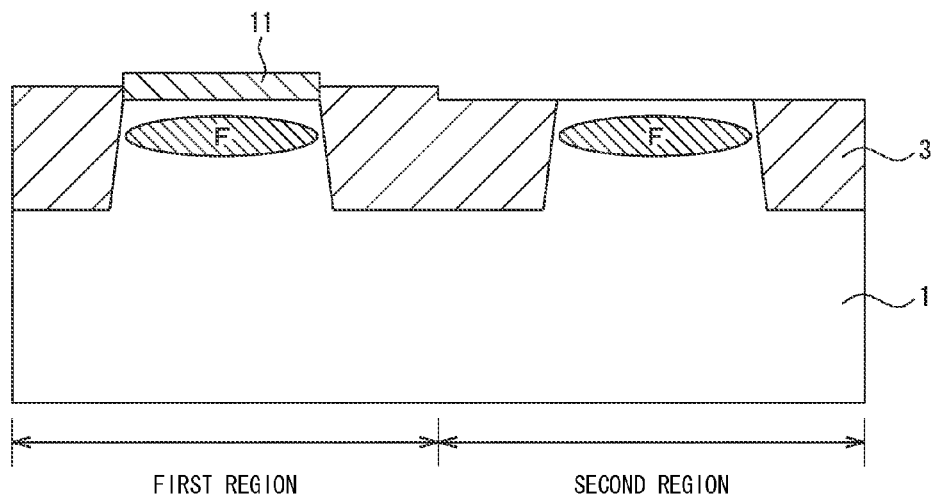
FIGS. 6A and 6B are diagrams illustrating the method for manufacturing a semiconductor device according to the embodiment (part 6)
Figure 6B:
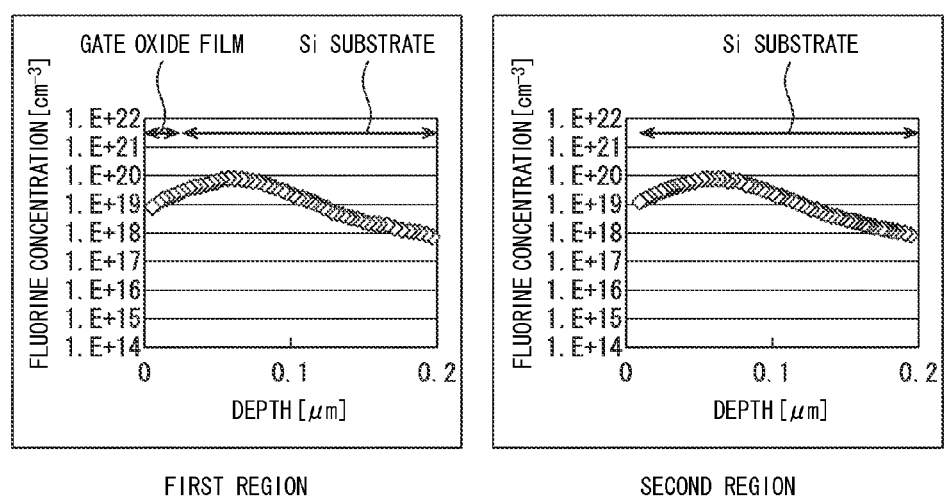

Then, the resist pattern is removed as illustrated in FIG. 6A. Then the CVD oxide film left on the first gate oxide film 11 in the first region is removed by wet etching. The wet etching may be performed using hydrofluoric acid, for example. As a result, the first gate oxide film 11 is exposed in the first region.

Note that the first gate oxide film 11 is a silicon oxide film formed by thermal oxidation (i.e. a thermal oxide film). Hydrofluoric acid etches the CVD oxide film at an etch rate higher than the etch rate at which it etches the thermal oxide film. Accordingly, the CVD oxide film 13 can be etched off with a high selectivity with respect to the first gate oxide film 11. This can minimize loss of the thickness of the first gate oxide film 11. Note that the removal of the CVD oxide film 13 from the first region does not change the concentration profile of fluorine as can be seen by comparison between FIGS. 5B and 6B.

Then, as illustrated in FIG. 7A, the surface of the silicon substrate 1 is thermally oxidized again to form a second gate oxide film 21 in the second region. The second gate oxide film 21 may be a silicon oxide film, for example, with a thickness of approximately 3 (nm), for example. In this embodiment, fluorine implanted in the first and second regions diffuses at the same time by heat during the formation of the second gate oxide film 21. Part of the fluorine implanted in the first region is taken into the first gate oxide film 11/silicon substrate 1 interface and the first gate oxide film 11. Part of the fluorine implanted in the second region is taken into the second gate oxide film 21/silicon substrate 1 interface and the second gate oxide film 21.

Figure 7B:
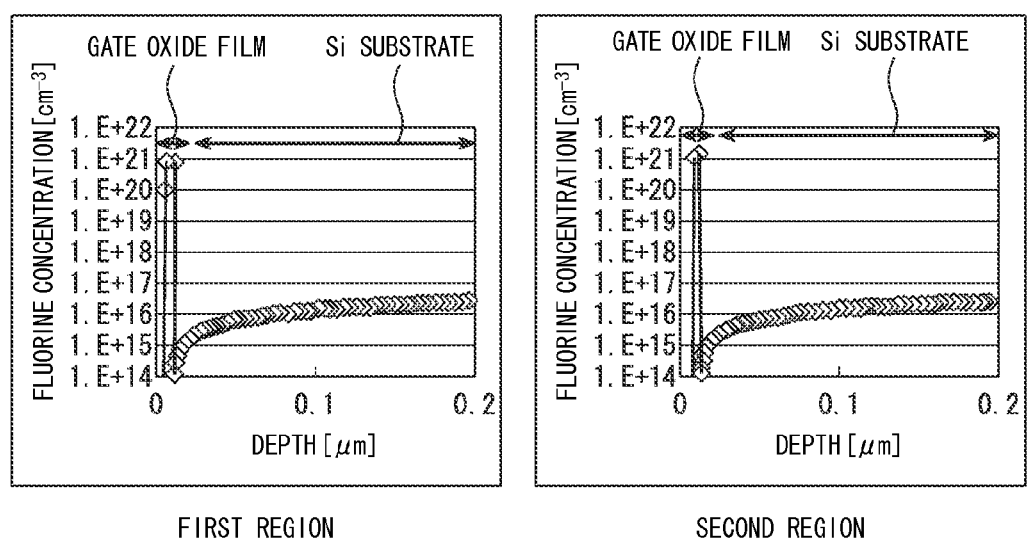

In this way, fluorine implanted in each of the first and second regions diffuses by heat during the formation of the second gate oxide film rather than heat during the formation of the first gate oxide film 11. This can keep the concentration of fluorine in the second gate oxide film 21 high as illustrated in FIG. 7B after the second gate oxide film 21 has been formed.

When the second gate oxide film 21 is formed, the CVD oxide film 13 (see FIG. 5A) is not present on top of the first gate oxide film 11.

Note that when the second gate oxide film 21 is formed, the surface of the first gate oxide film 11 is exposed. Accordingly, thermal oxidation can further proceed at the first gate oxide film 11/silicon substrate 1 interface depending on the conditions (for example, temperature and time) under which the thermal oxidation for forming the second gate oxide film 21 is performed, for example. In that case, the first gate oxide film 11 will thicken, although not depicted.

Although not depicted, a polysilicon film, which will function as a gate electrode, is then deposited over the entire silicon substrate 1. The thickness of the polysilicon film may be approximately 250 (nm), for example. Then the steps of forming gate electrodes, the step of forming source/drain regions, and the step of forming interconnects and an interlayer insulating film are performed by using a conventional semiconductor manufacturing process. Passing through these steps, a first MOS transistor having the first gate oxide film 11 in the first region of the silicon substrate 1 is completed and a second MOS transistor having the second gate oxide film 21 in the second region of the silicon substrate 1 is completed.

(2) Advantageous Effects of Embodiments

According to embodiments of the present invention, fluorine is directly implanted into the silicon substrate 1 without passing through a gate electrode. Accordingly, impurities (i.e. a donor element or an accepter element) contained in the gate electrode can be prevented from diffusing through the gate oxide film together with fluorine and being introduced into the gate oxide film/silicon substrate interface, thereby facilitating introduction of fluorine alone to the gate oxide film/silicon substrate interface. Thus, fluctuations in the threshold voltages of the first and second MOS transistors and other problems can be prevented.

The step of implanting fluorine described above is performed between the step of forming the first gate oxide film 11 (see FIG. 2A) and the step of forming the second gate oxide film 21 (see FIG. 7A). Accordingly, fluorine implanted into the silicon substrate 1 diffuses by heat during the formation of the second gate oxide film 21 rather than heat during the formation of the first gate oxide film 11. Therefore, the fluorine concentration at the first gate oxide film 11/silicon substrate 1 interface in the first region (i.e. the first interface) can be kept high and the fluorine concentration at the second gate oxide film 21/silicon substrate 1 interface in the second region (i.e. the second interface) can also be kept high. Consequently, dangling bonds at each of the first and second interfaces can be sufficiently terminated to reduce interface states.

(3) Others

While an embodiment has been described in which the first gate oxide film 11 and the second gate oxide film 21 are silicon oxide films ($SiO_2$), the first gate oxide film 11 and the second gate oxide film 21 in the present invention are not limited to silicon oxide films. The first gate oxide film 11 and the second gate oxide film 21 may be silicon oxynitride (SiON) films. Additionally, the first gate oxide film 11 and the second gate oxide film 21 are not limited to films of the same type. For example, the first gate oxide film 11 may be a silicon oxide film and the second gate oxide film 21 may be a silicon oxynitride film. Such embodiments have the same advantageous effects as the embodiment described above.

The scope of the present invention is not limited by exemplary embodiments illustrated and described, any embodiments that have advantageous effects equivalent to those intended by the present invention fall within the scope of the present invention. Furthermore, the scope of the present invention is not limited to combinations of features of the present invention defined by the claims but can be defined by any desired combinations of particular ones among all the features disclosed.

REFERENCE SIGNS LIST

1 Silicon substrate
3 Field oxide film
11 First gate oxide film
13 CVD oxide film
15 Resist pattern
21 Second gate oxide film

The invention claimed is:

1. A method for manufacturing a semiconductor device, the semiconductor device including a first MOS transistor in a first region of a semiconductor substrate and a second MOS transistor in a second region of the semiconductor substrate, the method comprising:
   forming a first gate oxide film in each of the first region and the second region by thermally oxidizing the semiconductor substrate;
   forming a protective film on the first gate oxide film;
   implanting fluorine into each of the first region and the second region through the protective film and the first gate oxide film;
   removing, after the implantation of the fluoride, the protective film from the first gate oxide film in the second region;
   removing the first gate oxide film from the second region; and
   forming a second gate oxide film in the second region by thermally oxidizing the semiconductor substrate in a state where the first gate oxide film is left in the first region and the first gate oxide film is removed from the second region, the second gate oxide film being different in thickness or type from the first gate oxide film.

2. The method for manufacturing the semiconductor device according to claim 1, further comprising,
   removing the protective film from the first gate oxide film in the first region, between the removing the first gate oxide film from the second region and the forming the second gate oxide film in the second region.

3. The method for manufacturing the semiconductor device according to claim 1, wherein,
   the semiconductor substrate is a silicon substrate;
   a silicon oxide film is formed as the first gate oxide film in the forming the first gate oxide film; and a silicon oxide film is formed as the protective film by a low-pressure CVD method in the forming the protective film.

4. The method for manufacturing the semiconductor device according to claim 2, wherein, the semiconductor substrate is a silicon substrate;

a silicon oxide film is formed as the first gate oxide film in the forming the first gate oxide film; and a silicon oxide film is formed as the protective film by a low-pressure CVD method in the forming the protective film.

\* \* \* \* \*